US008680515B2

(12) United States Patent
Kanungo et al.

(10) Patent No.: US 8,680,515 B2
(45) Date of Patent: Mar. 25, 2014

(54) DIGITAL MARKING USING A BIPOLAR IMAGING MEMBER

(75) Inventors: Mandakini Kanungo, Webster, NY (US); Kock-Yee Law, Penfield, NY (US); George C. Cardoso, Webster, NY (US)

(73) Assignee: Xerox Corporation, Norwalk, CT (US)

(*) Notice: Subject to any disclaimer, the term of this patent is extended or adjusted under 35 U.S.C. 154(b) by 294 days.

(21) Appl. No.: 13/100,265

(22) Filed: May 3, 2011

(65) Prior Publication Data

US 2012/0281052 A1 Nov. 8, 2012

(51) Int. Cl.

| | |
|---|---|
| ***H01L 29/08*** | (2006.01) |
| ***B41J 2/00*** | (2006.01) |
| ***B41J 2/41*** | (2006.01) |
| ***B41J 2/45*** | (2006.01) |

(52) U.S. Cl.

USPC .............. 257/40; 347/110; 347/112; 347/238

(58) Field of Classification Search

USPC ............................ 347/110, 112, 238; 257/40

See application file for complete search history.

(56) References Cited

U.S. PATENT DOCUMENTS

| | | | | |
|---|---|---|---|---|
| 6,100,909 | A | 8/2000 | Haas et al. | |
| 2005/0007494 | A1* | 1/2005 | Yamazaki et al. | 348/552 |
| 2005/0263757 | A1* | 12/2005 | Lee | 257/40 |
| 2005/0270259 | A1* | 12/2005 | Shirasaki et al. | 345/76 |
| 2006/0257748 | A1* | 11/2006 | Tsukamoto et al. | 430/1 |
| 2007/0023747 | A1* | 2/2007 | Loutfy et al. | 257/40 |
| 2007/0152370 | A1* | 7/2007 | Roberts et al. | 264/255 |
| 2009/0114273 | A1* | 5/2009 | Kamat | 136/252 |
| 2010/0171133 | A1* | 7/2010 | Yanashima et al. | 257/98 |
| 2011/0039201 | A1* | 2/2011 | Law et al. | 430/124.1 |

OTHER PUBLICATIONS

Kock-Yee Law et al., "Digital Electrostatic Latent Image Generating Member," U.S. Appl. No. 12/539,397, filed Aug. 11, 2009.

Kock-Yee Law et al., "Direct Digital Marking Systems," U.S. Appl. No. 12/869,605, filed Aug. 26, 2010.

Kock-Yee Law at al., "Electrostatic Digital Offset/Flexo Printing," U.S. Appl. No. 12/854,526, filed Aug. 11,2010.

* cited by examiner

*Primary Examiner* — Sarah Al Hashimi

(74) *Attorney, Agent, or Firm* — MH2 Technology Law Group LLP

(57) ABSTRACT

Various embodiments provide materials and methods for direct digital marking, wherein a surface charge contrast can be formed by oppositely addressing adjacent charge injection pixels of a bipolar imaging member and developed with enhanced image contrast at a reduced voltage of the transistors.

10 Claims, 5 Drawing Sheets

DIGITAL MARKING USING A BIPOLAR IMAGING MEMBER

DETAILED DESCRIPTION

1. Field of Use

The present teachings relate to xerographic printing and marking systems and, more particularly, to systems and methods of direct digital marking.

2. Background

Conventionally, there are two digital printing technology platforms, namely xerography and inkjet printing. Current xerographic printing involves multiple steps including charging of the photoreceptor and forming a latent image on the photoreceptor; developing the latent image; transferring and fusing the developed image onto a media; and erasing and cleaning the photoreceptor. Although xerographic printing is a mature technology, challenges remain in reducing unit manufacturing cost (UMC) and run cost. Other than the digital input, the xerographic printing system is essentially an analog device.

Solid inkjet printing (SIJ) is another printing technology which is now serving the office color market and is working its way towards the production color market. However, there are many challenges to mastering SIJ including low unit UMC, high print quality, and wide media range with press-like reliability. The common issues for all these print platforms are that the print systems are very complex. The system complexity leads to complicated print processes, high UMC, and high run cost.

Accordingly, there is a need for print members that are simple, small, fast, green, smart, and low cost, to provide marking methods with enhanced image contrast but with low biasing voltages.

SUMMARY

According to various embodiments, the present teachings include a bipolar imaging member. The bipolar imaging member can include a plurality of charge injection pixels disposed over a substrate with each pixel of the plurality of charge injection pixels individually addressable and including one or more of a nano-carbon-containing material, a conjugated polymer, and a combination thereof. The bipolar imaging member can also include a single, continuous layer of bipolar CTL or a plurality of bipolar charge transport layers (CTLs) with each bipolar CTL disposed over one pixel of the plurality of charge injection pixels and configured to transport either holes or electrons provided by the underlying pixel, in response to an electrical bias, to a surface of the bipolar CTL opposing an interface of the bipolar CTL with the underlying pixel. The bipolar imaging member can further include a plurality of thin film transistors disposed over the substrate such that each thin film transistor is connected to one or more pixels of the plurality of charge injection pixels to provide the electrical bias.

According to various embodiments, the present teachings also include a digital marking method. In this method, a bipolar imaging member can be provided to include a single, continuous layer or a plurality of bipolar charge transport layers (CTLs) each disposed over one pixel of a plurality of charge injection pixels, wherein each pixel of the plurality of charge injection pixels is individually addressable to inject both holes and electrons in response to an electrical bias. A surface charge contrast can be generated on the bipolar imaging member by oppositely biasing adjacent pixels of the plurality of charge injection pixels such that holes are injected by a first pixel of the plurality charge injection pixels and transported through a corresponding bipolar CTL to a first surface, and electrons are injected by a second pixel adjacent to the first pixel and transported through a corresponding bipolar CTL to a second surface of the bipolar imaging member. A developing material can then be developed on one of the first surface and the second surface of the bipolar imaging member to form a developed image.

According to various embodiments, the present teachings further include a digital marking method by first providing a bipolar imaging member. The bipolar imaging member can include a single, continuous layer or a plurality of bipolar charge transport layers (CTLs) each disposed over one pixel of a plurality of charge injection pixels; wherein each pixel is individually addressable to inject either holes or electrons in response to an electrical bias by a thin film transistor. An enhanced surface charge contrast can then be generated on the bipolar imaging member by oppositely biasing adjacent pixels of the plurality of charge injection pixels such that holes are injected by a first pixel of the plurality charge injection pixels and transported through a corresponding bipolar CTL to a first surface, and electrons are injected by a second pixel adjacent to the first pixel and transported through a corresponding bipolar CTL to a second surface of the bipolar imaging member. A developing material can then be provided in proximity to a development nip formed between a development subsystem and the bipolar imaging member, and be electrostatically developed on one of the first surface and the second surface of the bipolar imaging member to form a developed image. The developed image can be transferred from the bipolar imaging member onto a media.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrate several embodiments of the present teachings and together with the description, serve to explain the principles of the present teachings.

It should be noted that some details of the figures have been simplified and are drawn to facilitate understanding of the embodiments rather than to maintain strict structural accuracy, detail, and scale.

DESCRIPTION OF THE EMBODIMENTS

Reference will now be made in detail to embodiments of the present teachings, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely exemplary.

Various embodiments provide materials and methods for direct digital marking, wherein a surface charge contrast can be formed by oppositely addressing adjacent charge injection pixels of a bipolar imaging member. The surface charge contrast can form a latent image and can be developed by various developing materials. Because of the bipolar nature of the disclosed imaging member, image contrast between image and non-image areas can be increased at a reduced bias voltage.

Figure 1:
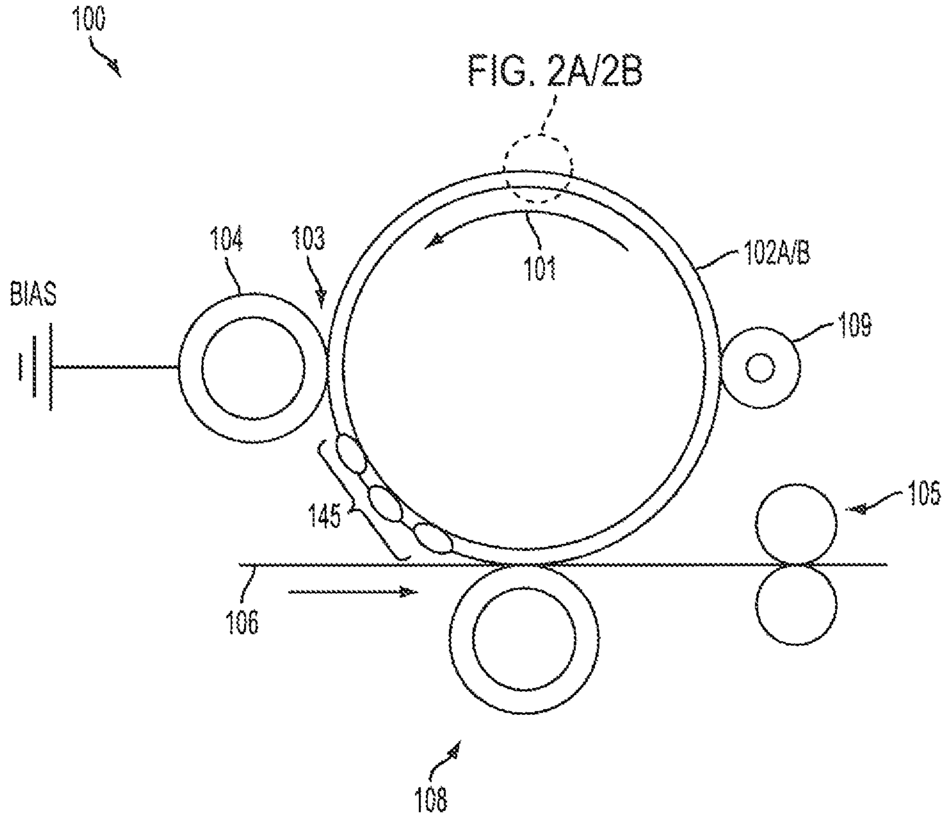
FIG. 1 schematically depicts a portion of an exemplary direct digital marking system in accordance with various embodiments of the present teachings.

FIG. 1 schematically illustrates a portion of an exemplary digital marking system 100, according to various embodiments of the present teachings. The exemplary digital marking system 100 can include a bipolar imaging member 102A or 102B for forming a surface charge contrast, which is also referred to herein as "an electrostatic latent image". The bipolar imaging member 102 NB can rotate in a direction 101.

Figure 2A:
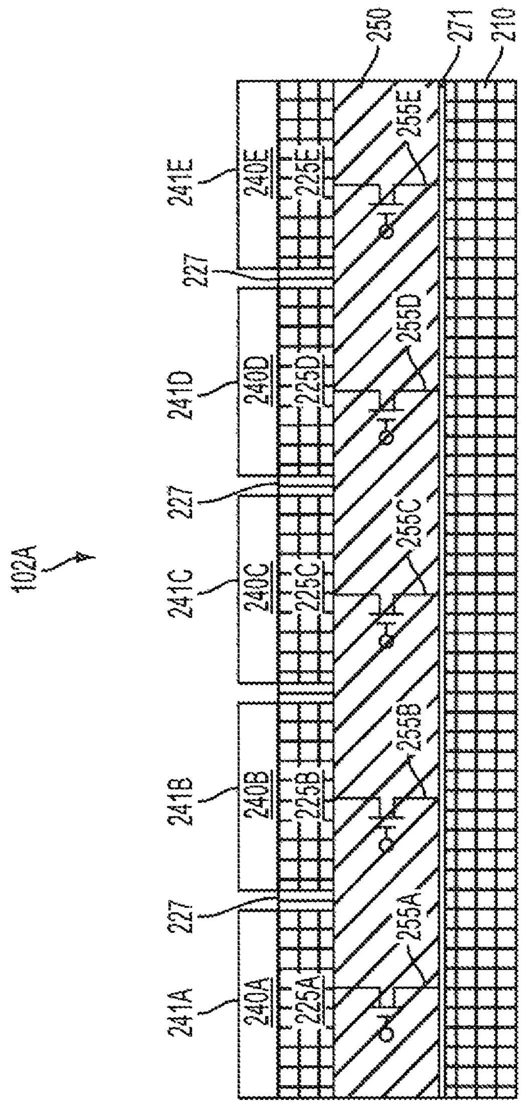
FIGS. 2A-2B schematically depict a cross sectional view of a portion of exemplary bipolar imaging members in accordance with various embodiments of the present teachings.
Figure 2B:
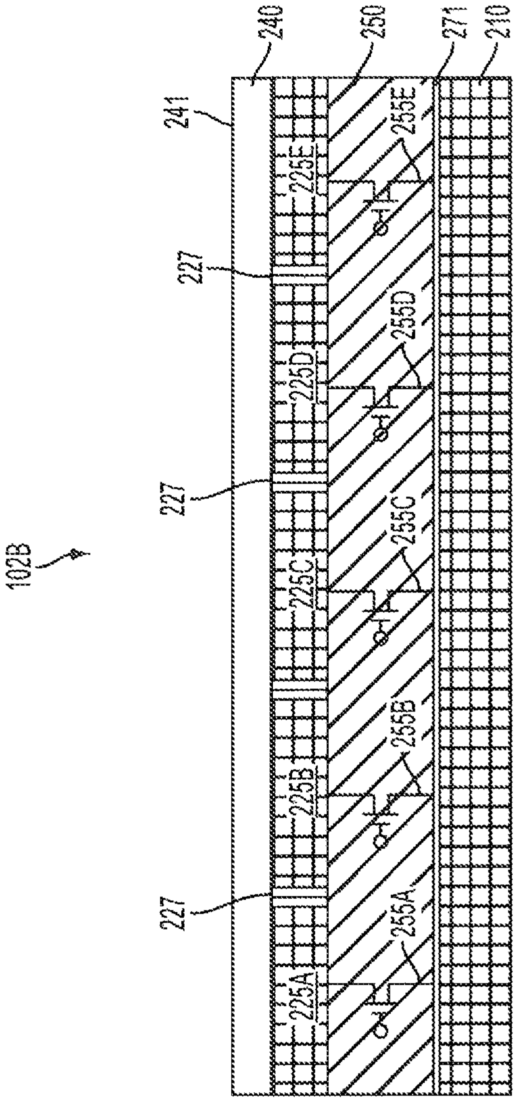

FIGS. 2A-2B schematically illustrate a cross sectional view of a portion of exemplary bipolar imaging members 102A-B in accordance with various embodiments of the present teachings. The bipolar imaging member 102A can include a plurality of bipolar charge transport layers (CTLs) 240 A-E, a plurality of charge injection pixels 225 A-E, and/or a plurality of thin film transistors (TFTs) 255 A-E, which are disposed over a substrate 210. In another embodiment, the bipolar imaging member 1026 can include a single, continuous bipolar charge transport layer (CTL) 240, a plurality of charge injection pixels 225 A-E, and/or a plurality of thin film transistors (TFTs) 255 A-E, which are disposed over a substrate 210. Note that the bipolar CTLs 240 A-E in FIG. 2A or the layer 240 in FIG. 2B, the charge injection pixels 225 A-E, and/or the TFTs 255 A-E shown in FIGS. 2A-2B are exemplary and any possible number of each element can be included. As used herein, the term "charge injection pixel(s)" is used interchangeably with the term "pixel(s)".

The substrate 210 can be formed of any suitable materials including, but not limited to, mylar, polyimide (PI), flexible stainless steel, poly(ethylene napthalate) (PEN), and flexible glass.

Over the substrate 210, each of the plurality of bipolar CTLs 240 can be disposed over one of the plurality of charge injection pixels 225, wherein each bipolar CTL 240 can include a surface 241 opposite to the plurality of charge injection pixels 225.

In one embodiment as shown in FIG. 2A, each of the plurality of bipolar CTLs 240 A-E can be discrete or isolated from each other. In another embodiment as shown in FIG. 2B, instead of being discrete or isolated, the plurality of bipolar CTLs 240 A-E can form a single, continuous bipolar charge transport layer (CTL) 240 or can be configured as/in a single, continuous bipolar CTL 240, disposed over all pixels of the plurality of charge injection pixels 225.

The bipolar CTLs 240 in FIGS. 2A-2B can be configured to transport charge carriers, such as, for example, holes and/or electrons, provided by corresponding pixels 225 in response to an electrical bias applied to corresponding TFTs 255, to the surfaces 241 of the bipolar CTLs 240. The TFTs 255 can be disposed, e.g., over the substrate 210. Each TFT 255 can be coupled to one (or more) pixels 225 such that each pixel 225 or a group of pixels selected from the plurality of pixels 225 can be individually addressable.

The phrase "individually addressable" as used herein means that each pixel of the plurality of charge injection pixels can be identified and manipulated independently from its neighboring or surrounding pixel(s). For example, referring to FIGS. 2A-2B, each of the pixels 225 A-E can be individually turned on or off independently from its neighboring or adjacent pixels. However in some embodiments, instead of addressing the pixels 225 A-E individually, a group of pixels, e.g., a first group of pixels including such as 225 A-C, can be selected and addressed together. That is, the first group of pixels 225 A-C can be turned on or off together independently from a second group of pixels including for example 225 D and/or 225 E or other groups of pixels selected from the plurality of pixels.

As shown in FIGS. 2A-2B, a layer stack containing one bipolar CTL 240 over a corresponding charge injection pixel 225 that can be electrically isolated from each other by a dielectric material 227. The dielectric material 227 can be formed of any known dielectric materials to electrically isolate adjacent pixels 225, and to avoid cross talk and lateral charge migration (LCM) between adjacent pixels.

Each bipolar CTL 240 can include one or more charge transporting molecules that are capable of transporting both holes and electrons, e.g., from an interface with the pixel 225 to an opposing surface of the bipolar CTL 240. In embodiments, the charge transporting molecules can include a monomer that allows free holes/electrons generated at the interface of the bipolar CTL 240 and the pixel 225 to be transported across the bipolar CLT 240 and to the surface 241.

The charge transporting molecules used in the bipolar CTLs 240 that can transport both holes and electrons can include, but are not limited to, phenyl-C61-butyric acid methyl ester (PCBM, a fullerene derivative); butylcarboxylate fluorenone malononitrile (BCFM); 4,4',4"-tris(8-quinoline)-triphenylamine (TQTPA), N,N'-bis(1,2-dimethylpropyl)-1,4,5,8-naphthalenetetracarboxylic diimide (NTDI) including modified NTDI's for higher solubility; 1,1'-dioxo-2-(4-methylphenyl)-6-phenyl-4-(dicyanomethylidene)thiopyran (PTS); 2-ethylehexylcarboxylate fluorenone malononitrile (2EHCFM); 1,1-(N,N'-bisalkyl-bis-4-phthalimido)-2,2-biscyano-ethylenes (BIB-CNs) and a mixture thereof.

The chemical structure of the exemplary charge transporting molecule PCBM can be:

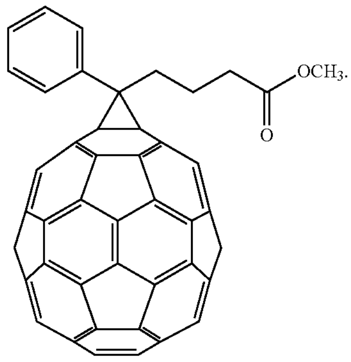 [SMILES: COC(=O)CCC[C@]1(c2ccccc2)[C@@H]2c3cc4c5c6c(cc7ccc8cc9c%10c%11c(cc(c%12c3c5c(c%12%11)c3c6c7c8c%103)[C@@H]21)C9)C4]

The chemical structure of the exemplary charge transporting molecule BCFM can be:

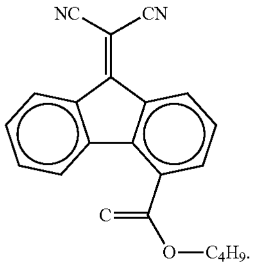

In embodiments, the charge transporting molecules can be dispersed within a polymer matrix to form the bipolar CTLs 240. For example, the charge transporting molecules can be dissolved or molecularly dispersed in an electrically inert polymer. In one embodiment, the charge transporting molecules can be dissolved in the electrically inert polymer to form a homogeneous phase with the polymer. In another embodiment, the charge transporting molecules can be molecularly dispersed in the polymer at a molecular scale.

The charge transporting molecules can have a concentration ranging from about 1% to about 90%, or from about 5% to about 75%, or from about 10% to about 50% by weight of the total bipolar CTLs 240.

Any suitable electrically inert polymers can be employed including, but not limited to, polycarbonates, polyarylates, polystyrenes, acrylate polymers, vinyl polymers, cellulose polymers, polyesters, polysiloxanes, polyimides, polyurethanes, poly(cyclo olefins), polysulfones, and epoxies, and/or random or alternating copolymers thereof.

In various embodiments, the bipolar charge transport layers 240 can include optional functional materials including, but not limited to, conducting polymer blends of p-type and n-type, p-type polypyrrole (PPy) in the matrix of an n-type conjugated ladder polymer, poly(benzimidazolebenzophenanthroline) (BBL), and/or Poly[2,6-(4,4-bis-(2-ethylhexyl)-4H-cyclopenta[2,1-b;3,4-b']dithiophene)-alt-4,7(2,1,3-benzothiadiazole)] (PCPDTBT).

The bipolar CTLs 240 including charge transporting molecules dispersed in an electrically inert polymer can allow the injection of holes and/or electrons from the charge injection pixels 225, and allow these holes/electrons to be transported through the bipolar charge transport layers 240 themselves to generate surface charge contrast on the surfaces 241.

In various embodiments, the pixels 225 can include one or more charge injection materials including, but not limited to, nano-carbon-containing materials, organic conjugated polymers, nano-carbon materials dispersed in one or more organic conjugated polymers, or other materials and their combinations.

As used herein, the phrase "nano-carbon material" refers to a carbon-containing material having at least one dimension on the order of nanometers, for example, less than about 1000 nm. In embodiments, the nano-carbon material can include, for example, carbon nanotubes including single-wall carbon nanotubes (SWNT), double-wall carbon nanotubes (DWNT), and multi-wall carbon nanotubes (MWNT); functionalized carbon nanotubes; and/or graphenes and functionalized graphenes, wherein graphene is a single planar sheet of $sp^2$-hybridized bonded carbon atoms that are densely packed in a honeycomb crystal lattice and is one or a few atom in thickness.

Carbon nanotubes, for example, as-synthesized carbon nanotubes after purification, can be a mixture of carbon nanotubes having a various number of walls, diameter, length, chirality, and/or defect rate. For example, chirality may dictate whether the carbon nanotube is metallic or semiconductive. Metallic carbon nanotubes can include about 33% metallic by weight of the metallic carbon. Carbon nanotubes can have a diameter ranging from about 0.1 nm to about 100 nm, or from about 0.5 nm to about 50 nm, or from about 1.0 nm to about 10 nm; and can have a length ranging from about 10 nm to about 5 mm, or from about 200 nm to about 10 μm, or from about 500 nm to about 1000 nm. In certain embodiments, the concentration of carbon nanotubes in the layer including one or more nano-carbon materials can be from about 0.5 weight % to about 100 weight %, or from about 50 weight % to about 99 weight %, or from about 90 weight % to about 99 weight %. In embodiments, the carbon nanotubes can be, mixed with a binder material to form the layer of one or more nano-carbon materials. The binder material can include any binder polymers as known to one of ordinary skill in the art.

In other embodiments, the thin layer of carbon nanotubes can include a carbon nanotube composite, including but not limited to carbon nanotube polymer composite and carbon nanotube filled resin. In embodiments, each pixel 225 can include one or more layers of nano-carbon containing layers and/or other possible layers of charge injection materials.

For example, the charge injection materials used for each pixel 225 can include organic conjugated polymers, such as, conjugated polymers based on ethylenedioxythiophene (EDOT) or based on its derivatives. The conjugated polymers can include, but are not limited to, polythiophene, polypyrrole, poly(3,4-ethylenedioxythiophene) (PEDOT), alkyl substituted EDOT, phenyl substituted EDOT, dimethyl substituted polypropylenedioxythiophene, cyanobiphenyl substituted 3,4-ethylenedioxythiopene (EDOT), teradecyl substituted PEDOT, dibenzyl substituted PEDOT, an ionic group substituted PEDOT, such as, sulfonate substituted PEDOT, a dendron substituted PEDOT, such as, dendronized poly(para-phenylene), and the like, and mixtures thereof. In further embodiments, the organic conjugated polymer can be a complex including PEDOT and, for example, polystyrene sulfonic acid (PSS). The molecular structure of the PEDOT-PSS complex can be shown as the following:

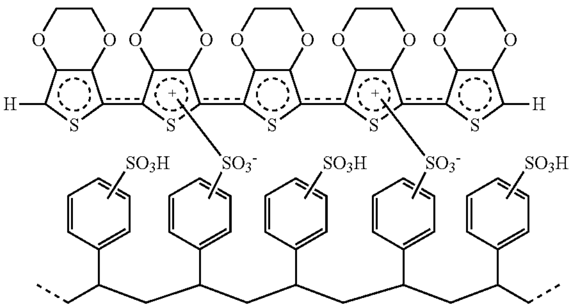

In embodiments, the charge injection pixel(s) 225 can have surface resistivity ranging from about 10 ohm/sq. to about 10,000 ohm/sq. or from about 10 ohm/sq. to about 5,000 ohm/sq. or from about 100 ohm/sq. to about 2,500 ohm/sq. One of the advantages of using a bipolar CTL 240 disposed over each charge injection pixel 225 is that they can be easily formed or patterned by various fabrication techniques, such as, for example, photolithography, inkjet printing, screen printing, transfer printing, and the like.

Any suitable and conventional techniques can be utilized to form the layer stacks of the bipolar charge transport layers 240 over the pixels 225. For example, the plurality of charge injection pixels 225 that include nano-carbon-containing materials can be formed from an aqueous dispersion or an alcohol dispersion of carbon nanotubes wherein the carbon nanotubes can be stabilized by a surfactant or a DNA or a polymeric material. The aqueous dispersion can then be applied and/or dried to the entire surface of the underlying substrate.

Likewise, a layer containing bipolar CTLs 240 can also be formed in a single or multiple coating/drying steps on the formed layer containing the charge injection pixels 215. After a patterning and/or etching process, the plurality of bipolar CLTs 240 can be formed over the plurality of charge injection pixels 225. Dielectric materials 227 can then be filled or otherwise formed between adjacent layer stacks including the bipolar CTL 240 over the pixel 225. In another embodiment, the CTL can be a single, continuous layer (see FIG. 2B) formed by simple solution coating technique.

During the formation, the coating techniques can include spraying, dip coating, roll coating, wire wound rod coating, ink jet coating, ring coating, gravure, drum coating, and the like. The drying process can be effected by any suitable conventional technique such as oven drying, infra red radiation drying, air drying and the like. Suitable nano-fabrication techniques can be used. For example, the materials can be directly patterned by nano-imprinting, inkjet printing and/or screen printing.

As a result, each pixel 225 can have at least one dimension, e.g., length or width, of about 1000 μm or less, for example, ranging from about 100 nm to about 500 μm, or from about 1 μm to about 250 μm, or from about 5 μm to about 150 μm. In embodiments, each bipolar CTL 240 after drying can have a thickness in the range of about 1 μm to about 50 μm, or about 5 μm to about 45 μm, or about 15 μm to about 40 μm, but can also have thickness outside this range.

Referring back to FIGS. 2A-2B, various other functional layer(s) can be included in the bipolar imaging members 102A-B. In some embodiments, the bipolar imaging members 102A-B can also include an optional adhesion layer 271 disposed between the substrate 210 and each pixel 225 of the plurality of pixels 225 and/or disposed between the substrate 210 and the thin film transistors 225.

Exemplary polyester resins which can be utilized for the optional adhesion layer can include polyarylatepolyvinylbutyrals, such as, U-100 available from Unitika Ltd., Osaka, JP; VITEL PE-100, VITEL PE-200, VITEL PE-200D, and VITEL PE-222, all available from Bostik, Wauwatosa, Wis.; MOR-ESTER™ 49000-P polyester available from Rohm Hass, Philadelphia, Pa.; polyvinyl butyral; and the like.

In this manner, the layer stack including a bipolar CTL 240 disposed over a charge injection pixel 225 can inject and transport both electrons and holes in response to an electrical bias such that a surface charge contrast can be formed on surface of the bipolar imaging members 102 A-B. That is, each bipolar imaging member 102 A/B can be charged and discharge in both positive and negative mode, as desired.

Figure 3A:
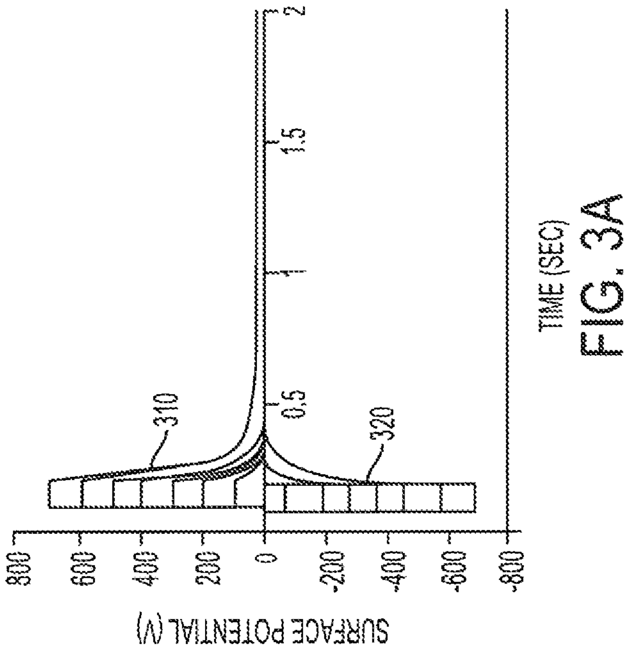
FIGS. 3A-3B depict charge-discharge characteristics of exemplary bipolar imaging members in accordance with various embodiments of the present teachings.
Figure 3B:
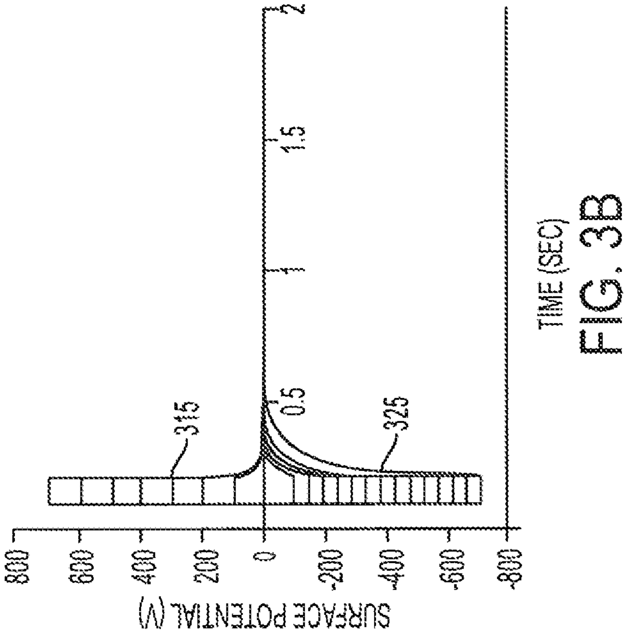

FIGS. 3A-3B depict charge-discharge characteristics of exemplary bipolar imaging members in accordance with various embodiments of the present teachings. Specifically, FIG. 3A depicts charge-discharge characteristics of an exemplary bipolar imaging member having a PCBM-containing bipolar CTL formed over a CNT-containing pixel. FIG. 3B depicts charge-discharge characteristics of an exemplary bipolar imaging member having a BCFM-containing bipolar CTL formed over a CNT-containing pixel.

Each exemplary bipolar imaging member of FIGS. 3A-3B can be positively charged/discharged (see 310/315 of FIGS. 3A-3B) and/or negatively charged/discharged (see 320/325 of FIGS. 3A-3B) depending on the polarity of the electrical bias applied thereto.

Referring back to FIG. 1, the direct digital marking system 100 can also include a development subsystem 104 in proximity to the bipolar imaging member 102 A/B, such that the development subsystem 104 and the bipolar imaging member 102 A/B can form a development nip 103. The development subsystem 104 can be electrically (either negatively or positively) biased or electrically grounded.

Figure 4:
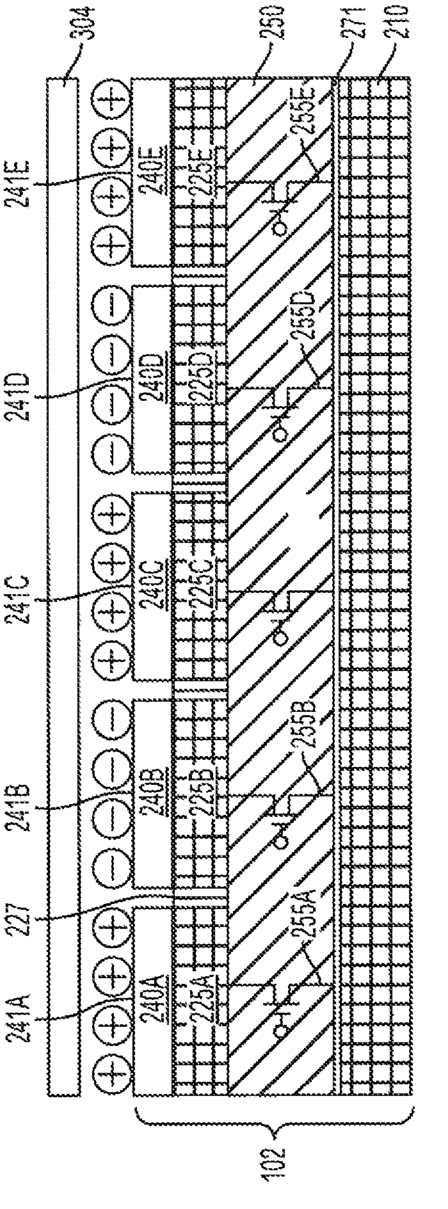
FIG. 4 schematically depicts an exemplary image developing method in accordance with various embodiments of the present teachings.

FIG. 4 schematically illustrates an exemplary image developing method in accordance with various embodiments of the present teachings.

As shown in FIG. 4, a surface charge contrast can be generated on the bipolar imaging member 102 by oppositely biasing adjacent charge injection pixels 225A-E or oppositely biasing adjacent groups of charge injection pixels 225. The bipolar imaging member 102 shown in FIG. 4 can be the bipolar imaging member shown in FIG. 2A or 2B.

In this example as shown, one of the pixels 225A (and/or 225C, and/or 225E) can be positively biased by a corresponding transducer 255A (and/or 255C, and/or 255E). Holes can then be injected by the pixel 225A (and/or 225C, and/or 225E) and transported through a corresponding bipolar CTL 240A (and/or 240C, and/or 240E) to a surface 241A (and/or 241C, and/or 241E) to provide the surface 241A (and/or 241C, and/or 241E) with positive surface charges. In another embodiment, the CTL 240 in FIG. 2B can be a single continuous layer and the regions corresponding to 241A, 241C and 241E as seen in FIG. 4 or FIG. 2A can be provided with positive charges.

Meanwhile, adjacent pixels of 225B and/or 225D can be negatively biased by the corresponding transducer 255B and/or 255D. Electrons can be injected by the pixel 225B (and/or 225D) and transported through a corresponding bipolar CTL 240B (and/or 240D) to a surface 241B (and/or 241D) of the bipolar imaging member 102 NB, to provide the surface with negative surface charges. In another embodiment, the CTL 240 (see FIG. 2B) can be a single continuous layer and the regions corresponding to 241B and 241D as seen in FIG. 4 or FIG. 2A can be provided with negative charges.

A surface charge contrast or in other words an electrostatic latent image can then be formed on the bipolar imaging member 102 A/B, for example, in the region within the development nip formed between the bipolar imaging member 102 A/B and the development electrode 304. The development electrode 304 can be an electrode of, for example, the development subsystem 104 of FIG. 1.

Because of this bipolar nature of the imaging members 102 A-B, the surface charge contrast can be enhanced compared to an imaging member with a unipolar CTL that transports only holes or electrons. In that case for creating a voltage contrast of ($|V_1|+|V_2|$) between two neighboring pixels, one pixel has to be biased at ($|V_1|+|V_2|$) while the other pixel has to be at ground potential. To the contrary, by using the disclosed bipolar imaging member, there can be an enhanced voltage contrast of magnitude ($|V_1|+|V_2|$) between developed and non-developed pixels in the bilayer device, while the individual transistors provide potentials of only V1 and $V_2$.

In the above example, if transistors 255A and/or 255C and/or 255E are positively biased having a bias voltage of ($+|V_1|$), the neighboring transistors 255B and/or 255D can be negatively biased having a bias voltage of $-|V_2|$, and the development electrode 304 can be at a bias voltage of $V_0$, where $|V_1|>V_0>-|V_2|$, or $V_0$ can be grounded. The resulting surface charge contrast can be characterized by $|V_1|+|V_2|$ between two adjacent pixels, whereas each transistor is subject to a maximum potential difference of either $|V_1|$ or $|V_2|$, if $|V_1|$ and $|V_2|$ have different values. Alternatively, each transistor can be subjected to be about half of the contrast potential difference if $|V_1|+|V_2|$, if $|V_1|=|V_2|$. Therefore, the latent image contrast or the surface charge contrast between any adjacent pixels can be enhanced at a reduced voltage of each transistor.

In embodiments, the surface charge contrast can be formed by addressing a first group of adjacent pixels (e.g., 225 A-C) and generating positive (or negative) surfaces for a first group of bipolar CTLs (e.g., 240 A-C) and oppositely addressing an adjacent, second group of adjacent pixels (e.g., 225 D-E) and generating negative (or positive) surfaces for a second group of bipolar CTLs (e.g., 240 D-E). The positive surfaces of the first group of pixels (e.g., 225 A-C) can be adjacent to the negative surfaces of the second group of pixels (e.g., 225 D-E) to form the surface charge contrast. Accordingly, an enhanced latent image contrast or the surface charge contrast between any two adjacent groups of pixels can be achieved with a lower bias voltage at the corresponding TFT as compared to the unipolar CTL. In another embodiment as shown in FIG. 2B, the single continuous CTL 240 and the regions corresponding to 240 A-C as seen in FIG. 4 or FIG. 2A can be positive and regions corresponding to 240 D-E as seen in FIG. 4 or FIG. 2A can be negative.

The surface charge contrast/electrostatic latent image can then be developed using any suitable developing materials to form a developed image on either the positively charged surface(s) (e.g., see 241A and/or 241C and/or 241E in FIG. 4) or the negatively charged surface(s) (e.g., see 241B and/or 241D). As used herein, the developed image area on the bipolar imaging member 102 can be referred to as an image area while the un-developed surface area on the bipolar imaging member 102 can be referred to as a non-image area or a background area. Due to use of the bipolar imaging members 102 A-B, image contrast between the image and non-image areas can be increased with lower bias voltages at the corresponding TFT as compared to the unipolar CTL Development can occur due to an electrostatic attraction between the developing material and oppositely-charged areas on the surfaces 241 of the bipolar CTLs 240 of the bipolar imaging member 102 A/B. The function of the development subsystem 104 is to present charged developing material to the surface charge contrast on the surface 241 of the bipolar imaging member 102 A/B.

The development subsystem electrostatics can be adjusted so that development can take place in either the positively charged areas or the negatively charged areas of the surface charge contrast on the surfaces 241 of the bipolar CTLs 240 of the bipolar imaging member 102 A/B. There can be many ways to perform this function, depending on the cost, size, and image quality required for the development subsystem 104. One option can be a two component magnetic, brush development, where the two components are developing material and larger (e.g., of about 30 to 70 microns in diameter) magnetic particles called carrier particles. The developing material, for example, toner particles can be charged triboelectricity (often referred to as static electricity) and can adhere to the carrier. The developer including the toner particles and the carrier particles can then be picked up by a magnetic roll, which results in a magnetic brush on the magnetic roll. Toner particles can then be electrostatically attracted to the oppositely charged areas of the bipolar imaging member 102 A/B, but repelled from the areas charged with the same polarity, thereby developing the latent image. Following development, the carrier can be returned to the development sump where it can acquire fresh toner.

Another option can be a donor roll. When the donor roll is used, a non-contact development can be performed. In this configuration, the toner on the magnetic brush can be electrostatically transferred to a donor roll, for example, a ceramic roll, forming a thin layer of charged toner. The charged toner on the donor roll can then be electrostatically developed onto the oppositely charged area of the bipolar imaging member. In embodiments, the gap between the donor roll and the bipolar imaging member can range from about 10 microns to about 50 microns.

In addition to powder toner, and/or liquid toner as described above, exemplary developing materials can include, but are not limited to, hydrocarbon based liquid ink, and/or flexo/offset ink.

Exemplary offset ink can include, but are not limited to, UVivid 820 Series UV Flexo ink, UVivid 850 Series UV Flexo ink, and UVivid 800 Series UV Flexo ink, all manufactured by FUJIFILM North America Corporation, Kansas City, Kans.; T&K Toka ALPO G QMDI waterless offset ink, Best One Mixing Inks, UV BF Inks, and UV VNL Inks, all manufactured by Spectro Printing Ink, LLC, Ralston, Nebr.; Megacure series, Megacure MW SO series, Megacure PV series, and Megacure HB series UV offset inks manufactured by Megami Ink Manufacturer, Ltd., Tokyo, JP; and Royal color, NWUV-16-846 and NWUV-16-848/849 UV flexo inks, and NWS2-10-931 water based flexo ink, manufactured by Atlantic Printing Ink, Ltd., Tampa, Fla.

Exemplary liquid based ink can include, such as, for example, flexo ink, UV flexo ink, offset ink, UV offset ink, water less offset ink, water based offset ink and/or hydrocarbon (e.g., isopar) based liquid ink. In certain embodiments, the liquid based and/or flexo-based ink can be optionally charged. That is, the surface charge contrast or the latent image can be developed through the development nip 103 (see FIG. 1) with, e.g., flexo ink and UV flexo ink, either charged or uncharged, to form a developed flexo-based image on the bipolar imaging member 102 A/B.

In some embodiments, the exemplary digital printing system 100 can optionally include UV-curing units, for example, a UV lamp or UV LED device, for curing the developed image 145 (see FIG. 1), when UV-curable inks are used. In exemplary embodiments, the UV-curable ink can be partially cured prior to the transfix process and can be finally cured after the transfix process. The UV-curable ink can include, for example, UV flexo ink or UV offset ink.

In this manner, for example, positively charged ink/toner drops can be developed on negatively charged surface and can be repelled by the positively charged surfaces, and vice versa.

Referring back to FIG. 1, the direct digital marking system 100 can also include a transfer subsystem 108 for transferring the developed image onto a media. During transferring, the media can come in substantially close contact with the developed image 145 on the surfaces (see 241 of FIGS. 2A-2B) of the bipolar imaging member 102 A/B. The transfer corona unit (not shown) behind the media 106 can give the media 106 a charge opposite that of the developing material and strong enough to overcome the developing material's adhesion to the bipolar imaging member 102 A/B. In some cases, a second precisely controlled corona charge unit can be used to reduce the electrostatic adhesion of the media 106 to the bipolar imaging member 102 A/B to enable release of the media 106, now containing the developed image transferred from the bipolar imaging member 102 NB. Alternatively, the transfer subsystem 108 can be a bias-able transfer roll as known to one of ordinary skill in the art.

For digital monochrome printers, the bipolar digital imaging member 102 NB can transfer the developed image 145 directly to the media 106. However, for most digital color printers the image can be formed from four colors (cyan, magenta, yellow and black) of the developing material and the developed image can be built up first on an intermediate surface. In some embodiments, the direct marking system 100 can include four bipolar digital imaging members 102 which can develop cyan, magenta, yellow, and black latent electrostatic images. Each colored developed image can then be transferred to a transfer belt in sequence. Once the full-color developed image is on the transfer belt, then another transfer can take place where the full-color developed image can be transferred to the media 106. However, the color printer can use a different sequence of events ultimately leading to a full-color developed image on the media. In the example of tandem configuration, each colored developed image can be transferred to the media in sequence.

The direct digital marking system 100 can also include a fuser subsystem 105, which can also be a transfixing system with transfer and fixing to the media at the same time, to fix the developed image onto the media. In the fusing process, the developing material can be heated under pressure so that it coalesces and penetrates into the media 106, such as paper fibers. Fusing can be accomplished by passing the media through a pair of rollers, for example. A heated roll can melt the developing material, which can be fused to the media under the application of pressure from a second roll. The gloss of the visible image can be controlled by the temperature, pressure, and/or the length of time that the developing material remains in the fuser nip.

In some embodiments, the direct digital marking system 100 can include a transfuse system to transfer and fuse the developed image onto the media 106 in one step instead of separate transfer subsystem and fusing subsystem.

In some embodiments, the direct digital marking system 100 can further include a cleaning subsystem 109. The transfer of the developing material from the bipolar imaging member 102 A/B to the media may not be 100% efficient in some cases. This is because the small developing material such as small toner particles and toner particles with a low charge can have a strong adhesion to the bipolar imaging member 102 A/B and as a result they can remain there after transfer. These particles must be removed from the bipolar imaging member 102 A/B before the next print cycle, or they can affect the printing quality of the next image.

In some embodiments, the cleaning subsystem 109 can include a compliant cleaning blade. The blade can rub against the bipolar imaging member 102 A/B and can scrape off any developing material that attempts to pass under it. In other embodiments, the cleaning subsystem 109 can include a rotating brush cleaner, which can be more efficient at removing developing material and less abrasive to the surface of the bipolar imaging member 102 A/B.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms “including,” “includes,” “having,” “has,” “with,” or variants thereof are used in either the detailed description and the claims, such terms are intended to be inclusive in a manner similar to the term “comprising.” Further, in the discussion and claims herein, the term “about” indicates that the value listed may be somewhat altered, as long as the alteration does not result in nonconformance of the process or structure to the illustrated embodiment. Finally, “exemplary” indicates the description is used as an example, rather than implying that it is an ideal.

Other embodiments of the present teachings will be apparent to those skilled in the art from consideration of the specification and practice of the present teachings disclosed herein. It is intended that the specification and examples be considered as exemplary only, with a true scope and spirit of the present teachings being indicated by the following claims.

What is claimed is:

1. A bipolar imaging member comprising:

a substrate;

a plurality of charge injection pixels disposed over the substrate, wherein each pixel of the plurality of charge injection pixels is separately insulated from all other pixels, and is individually addressable and comprises one or more functionalized nano-carbon-containing materials dispersed in one or more organic conjugated polymers;

a single-layer, bipolar charge transport layer (CTL), wherein the bipolar CTL is comprised of at least one functionalized nano-carbon-containing material and is disposed over at least one pixel of the plurality of charge injection pixels and is configured to transport both holes and electrons provided by the underlying pixel, in response to an electrical bias, to a surface of the bipolar CTL opposing an interface of the bipolar CTL with the underlying pixel; and a plurality of thin film transistors disposed over the substrate such that each thin film transistor is connected to one or more pixels of the plurality of charge injection pixels to provide the electrical bias.

2. The member of claim 1, wherein the plurality of bipolar CTLs is isolated from each other or configured as a single, continues bipolar charge transport layer.

3. The member of claim 1, wherein each bipolar CTL comprises a charge transporting molecule disposed within a polymer matrix;

wherein the charge transporting molecule comprises one or more of phenyl-C61-butyric acid methyl ester (PCBM); butylcarboxylate fluorenone malononitrile (BCFM); N,N'-bis(1,2-dimethylpropyl)-1,4,5,8-naphthalenetetracarboxylic diimide (NTDI); 1,1"-dioxo-2-(4-methylphenyl)-6-phenyl-4-(dicyanomethylidene)thiopyran (PTS); 2-ethylehexylcarboxylate fluorenone malononitrile (2EHCFM); 1,1-(N,N'-bisalkyl-bis-4-phthalimido)-2,2-biscyano-ethylenes (BIB-CNs) and a mixture thereof; and wherein the polymer matrix comprises an electrically inert polymer comprising one or more of polycarbonate, polyarylate, acrylate polymer, vinyl polymer, cellulose polymer, polyester, polysiloxane, polyamide, polyurethane, poly(cyclo olefin), polysulfone, and epoxy, and a random or alternating copolymer thereof.

4. The member of claim 1, wherein each pixel has a surface resistivity in the range of about 50 ohm/sq. to about 5,000 ohm/sq.

5. The member of claim 1, wherein the nano-carbon-containing material comprises a graphene or a carbon nanotube (CNT) comprising a single-wall CNT, a double-wall CNT, or a multi-wall CNT.

6. The member of claim 1, wherein the conjugated polymers comprises PEDOT-PSS, polythiophene, polypyrrole, or a combination of thereof.

7. The member of claim 1, wherein each pixel of the plurality of charge injection pixels has at least one of length and width of about 1000 μm or less.

8. The member of claim 1, wherein the substrate comprises one or more of mylar, polyimide, poly(ethylene napthalate), and flexible glass.

9. The member of claim 1, further comprising one or more adhesion layers disposed between the substrate and the plurality of charge injection pixels or between the substrate and the plurality of thin film transistors.

10. A printing apparatus comprising the member of claim 1, wherein the printing apparatus is a dry/liquid digital xerographic printer or a digital flexo/offset printer.

* * * * *